US008822911B2

(12) United States Patent
Sugiyama et al.

(10) Patent No.: US 8,822,911 B2
(45) Date of Patent: Sep. 2, 2014

(54) FOCUSED ION BEAM APPARATUS AND METHOD OF ADJUSTING ION BEAM OPTICS

(71) Applicant: Hitachi High-Tech Science Corporation, Tokyo (JP)

(72) Inventors: Yasuhiko Sugiyama, Tokyo (JP); Tatsuya Asahata, Tokyo (JP); Toshio Doi, Tokyo (JP); Hiroshi Oba, Tokyo (JP)

(73) Assignee: Hitachi High-Tech Science Corporation (JP)

( * ) Notice: Subject to any disclaimer, the term of this patent is extended or adjusted under 35 U.S.C. 154(b) by 0 days.

(21) Appl. No.: 13/839,989

(22) Filed: Mar. 15, 2013

(65) Prior Publication Data

US 2013/0240720 A1 Sep. 19, 2013

(30) Foreign Application Priority Data

Mar. 16, 2012 (JP) ................................. 2012-060961

(51) Int. Cl.
*H01J 3/14* (2006.01)
(52) U.S. Cl.
USPC .................................. 250/252.1; 250/396 R
(58) Field of Classification Search
CPC ............. H01J 37/04; H01J 3/14; H01J 37/10; H01J 37/08

USPC ........................................................ 250/252.1
See application file for complete search history.

(56) References Cited

U.S. PATENT DOCUMENTS

| 6,118,122 A * | 9/2000 | Koyama et al. ................. 850/43 |
| 2003/0173527 A1* | 9/2003 | Adachi et al. ............ 250/492.21 |
| 2009/0230299 A1* | 9/2009 | Shichi et al. .................. 250/282 |
| 2011/0186745 A1 | 8/2011 | Kqaga et al. .................. 250/396 |

FOREIGN PATENT DOCUMENTS

WO 2010016394 2/2010

* cited by examiner

*Primary Examiner* — Marcus Taningco
(74) *Attorney, Agent, or Firm* — Adams & Wilks

(57) ABSTRACT

Provided is a focused ion beam apparatus including a control portion configured to: store in advance, in a condenser voltage table, a calculation value of a condenser voltage for obtaining a reference beam current for all each of a plurality of apertures; obtain an experimental value of the condenser voltage for obtaining the reference beam current for a reference aperture; obtain a correction value of the condenser voltage by subtracting the calculation value stored for the reference aperture from the experimental value for the reference aperture; obtain setting values of the condenser voltage by adding the correction value to the calculation values stored for each of the plurality of the apertures; and store the obtained setting value in the condenser voltage table.

5 Claims, 8 Drawing Sheets

| EXTRACTING VOLTAGE | | 6.9 | | | 7.0 | | |
|---|---|---|---|---|---|---|---|
| | | CONDENSER VOLTAGE | | | CONDENSER VOLTAGE | | |
| | | CALCULATION VALUE | SETTING VALUE | CORRECTION VALUE | CALCULATION VALUE | SETTING VALUE | CORRECTION VALUE |
| AP | #1 $A_{10}$ | -17.9 | -17.53 | 0.37 | -18.5 | -18.13 | 0.37 |
| | #2 $A_{20}$ | -17.8 | -17.43 | 0.37 | -17.4 | -17.03 | 0.37 |
| | #3 $A_{30}$ | -18.0 | -17.63 | 0.37 | -18.6 | -18.23 | 0.37 |
| | #4 $A_{40}$ | -16.9 | -16.53 | 0.37 | -17.5 | -17.13 | 0.37 |
| | #5 $A_{50}$ | -15.8 | -15.43 | 0.37 | -16.4 | -16.03 | 0.37 |

| EXTRACTING VOLTAGE | 6.9 | | | 7.0 | | |
|---|---|---|---|---|---|---|
| | CONDENSER VOLTAGE | | | CONDENSER VOLTAGE | | |
| | CALCULATION VALUE | SETTING VALUE | CORRECTION VALUE | CALCULATION VALUE | SETTING VALUE | CORRECTION VALUE |
| AP #1 $A_{10}$ | -17.9 | -17.53 | 0.37 | -18.5 | -18.1 | 0.4 |
| #2 $A_{20}$ | -17.8 | -17.43 | 0.37 | -17.4 | -17.0 | 0.4 |
| #3 $A_{30}$ | -18.0 | -17.63 | 0.37 | -18.6 | -18.2 | 0.4 |
| #4 $A_{40}$ | -16.9 | -16.53 | 0.37 | -17.5 | -17.1 | 0.4 |
| #5 $A_{50}$ | -15.8 | -15.43 | 0.37 | -16.4 | -16.0 | 0.4 |

FIG. 11A  FIRST SET

| EXTRACTING VOLTAGE | | | 6.9 | | |
|---|---|---|---|---|---|
| | | | CONDENSER VOLTAGE | | |
| | | | CALCULATION VALUE | SETTING VALUE | CORRECTION VALUE |
| AP | #1 | $A_{10}$ | -17.90 | -17.53 | 0.37 |
| | | $A_{11}$ | -17.88 | -17.51 | 0.37 |
| | | $A_{12}$ | -17.86 | -17.49 | 0.37 |

FIG. 11B  SECOND SET

| EXTRACTING VOLTAGE | | | 6.9 | | |
|---|---|---|---|---|---|
| | | | CONDENSER VOLTAGE | | |
| | | | CALCULATION VALUE | SETTING VALUE | CORRECTION VALUE |
| AP | #1 | $A_{10}$ | -17.90 | -17.51 | 0.39 |
| | | $A_{11}$ | -17.88 | -17.49 | 0.39 |
| | | $A_{12}$ | -17.86 | -17.47 | 0.39 |

FOCUSED ION BEAM APPARATUS AND METHOD OF ADJUSTING ION BEAM OPTICS

CROSS-REFERENCE TO RELATED APPLICATIONS

This application claims priority from Japanese Patent Application No. 2012-060961 filed on Mar. 16, 2012, the entire contents of which are incorporated herein by reference.

TECHNICAL FIELD

Aspects of the present invention relate to a focused ion beam apparatus and a method of adjusting ion beam optics.

BACKGROUND

In related-art, for transmission electron microscope (TEM) sample preparing, photomask repairing, and the like, there has been proposed a method of using a focused ion beam apparatus to irradiate a target position with a focused ion beam to perform processing.

Generally, the focused ion beam apparatus includes an ion source for generating an ion beam, a condenser lens for condensing the ion beam, an aperture for reducing the ion beam diameter, and an objective lens for focusing the ion beam to the target. Generally, an einzel lens is adopted as the condenser lens. The einzel lens includes three electrodes (incident side electrode, intermediate electrode, and exit side electrode) which are arranged along an ion beam irradiation path. The incident side electrode and the exit side electrode are grounded, and a condenser voltage is applied to the intermediate electrode. Further, the focused ion beam apparatus includes an extracting electrode between the ion source and the condenser lens, and an extracting voltage is applied between the ion source and the extracting electrode to extract ions from the ion source.

Recently, in order to further reduce the ion beam diameter, there has been proposed an apparatus in which a bipotential lens is adopted as the condenser lens (for example, see International Patent WO2010/016394). The bipotential lens includes three electrodes (incident side electrode, intermediate electrode, and exit side electrode) which are arranged along an ion beam irradiation path. An extracting voltage is applied between the ion source and the incident side electrode so that the incident side electrode functions as the extracting electrode. Note that, the bipotential lens is similar to the einzel lens in that the condenser voltage is applied to the intermediate electrode, and the exit side electrode is grounded.

SUMMARY

When the ion source is used for a long period of time, generation of the ion beam becomes unstable. In order to stabilize the ion beam generation, it is necessary to change the extracting voltage.

However, the incident side electrode of the bipotential lens not only functions as the extracting electrode, but also functions as a part of the condenser lens. Therefore, when the extracting voltage is changed, the lens electric field is also changed, which causes change in the focused state of the ion beam. In order to maintain the focused state of the ion beam, the condenser voltage needs to be adjusted every time the extracting voltage is changed. In addition, when the apparatus includes a plurality of types of apertures having different aperture diameters, the condenser voltage needs to be set for each aperture, which leads to a problem in that a large amount of man-hours is required.

Aspects of the present invention provide a focused ion beam apparatus and a method of adjusting ion beam optics, which are capable of easily setting a condenser voltage with high accuracy.

According to an aspect of the present invention, there is provided a focused ion beam apparatus including: an ion source configured to supply ions; a condenser lens configured to condense an ion beam extracted from the ion source, the condenser lens including a bipotential lens including: a first electrode configured to extract the ion beam from the ion source in response to application of an extracting voltage between the first electrode and the ion source, and a second electrode configured to condense the ion beam extracted from the ion source in response to application of a condenser voltage between the second electrode and the ion source; a plurality of types of apertures having different aperture diameters and configured to reduce a diameter of the condensed ion beam; and a control portion including a condenser voltage table configured to store a setting value of the condenser voltage for obtaining a reference ion beam current at which the ion beam diameter is minimized in correspondence with an amount of the extracting voltage and the types of the apertures and being configured to set the condenser voltage based on the condenser voltage table, wherein the control portion is configured to: store in advance, in the condenser voltage table, a calculation value of the condenser voltage for obtaining the reference ion beam current for each of the plurality of types of the apertures, obtain, for a reference aperture among the plurality of types of the apertures, an experimental value of the condenser voltage for obtaining the reference ion beam current, obtain a correction value of the condenser voltage by subtracting the calculation value stored for the reference aperture from the experimental value for the reference aperture, obtain the setting values for each of the plurality of types of the apertures by adding the obtained correction value to the calculation values stored for each of the plurality of types of the apertures, and store the obtained setting values in the condenser voltage table.

The deviation of the experimental value from the calculation value of the condenser voltage occurs due to, for example, deviation of the distance between the ion source and the condenser lens from the design value due to the dimension error, or offset of a condenser lens control signal. The dimension error between the ion source and the condenser lens and the offset of the control signal are constant regardless of the type of the aperture, and hence the correction value as the deviation amount of the experimental value from the calculation value of the condenser voltage is also constant regardless of the type of the aperture.

In view of this, in the present invention, the correction value is added to each of the calculation values stored for the plurality of types of apertures, to thereby obtain the setting value of the condenser voltage and store the obtained setting value in the condenser voltage table. With this, merely by obtaining the experimental value of the condenser voltage for obtaining the reference ion beam current for only the reference aperture, the setting values of the condenser voltage for other apertures can be obtained. Therefore, the condenser voltage table can be easily created with high accuracy. Through setting of the condenser voltage based on this condenser voltage table, the condenser voltage can be easily set with high accuracy.

According to another aspect of the present invention, there is provided a method of adjusting ion beam optics for a focused ion beam apparatus configured to set a condenser voltage based on a condenser voltage table and including: an ion source configured to supply ions; a condenser lens configured to condense an ion beam extracted from the ion source; the condenser lens including a bipotential lens including: a first electrode configured to extract the ion beam from the ion source in response to application of an extracting voltage between the first electrode and the ion source, and a second electrode configured to condense the ion beam extracted from the ion source in response to application of the condenser voltage between the second electrode and the ion source; a plurality of types of apertures having different aperture diameters and configured to reduce a diameter of the condensed ion beam; and the condenser voltage table configured to store a setting value of the condenser voltage for obtaining a reference ion beam current at which the ion beam diameter is minimized in correspondence with an amount of the extracting voltage and the types of the apertures, the method including: storing in advance, in the condenser voltage table, a calculation value of the condenser voltage for obtaining the reference ion beam current for each of the plurality of types of the apertures; obtaining, for a reference aperture among the plurality of types of the apertures, an experimental value of the condenser voltage for obtaining the reference ion beam current; obtaining a correction value of the condenser voltage by subtracting the calculation value stored for the reference aperture from the experimental value for the reference aperture; obtaining the setting values for each of the plurality of types of the apertures by adding the obtained correction value to the calculation value stored for each of the plurality of types of the apertures; and storing the obtained setting value in the condenser voltage table.

With this, merely by obtaining the experimental value of the condenser voltage for obtaining the reference ion beam current for only the reference aperture, the setting values of the condenser voltage for other apertures can be obtained. Therefore, the condenser voltage table can be easily created with high accuracy.

BRIEF DESCRIPTION OF DRAWINGS

In the accompanying drawings:

FIGS. 11A and 11B are explanatory diagrams of condenser voltage tables of a third embodiment of the present invention.

DETAILED DESCRIPTION

In the following, embodiments of the present invention are described with reference to the accompanying drawings.

(First Embodiment Focused Ion Beam Apparatus)

Figure 1:
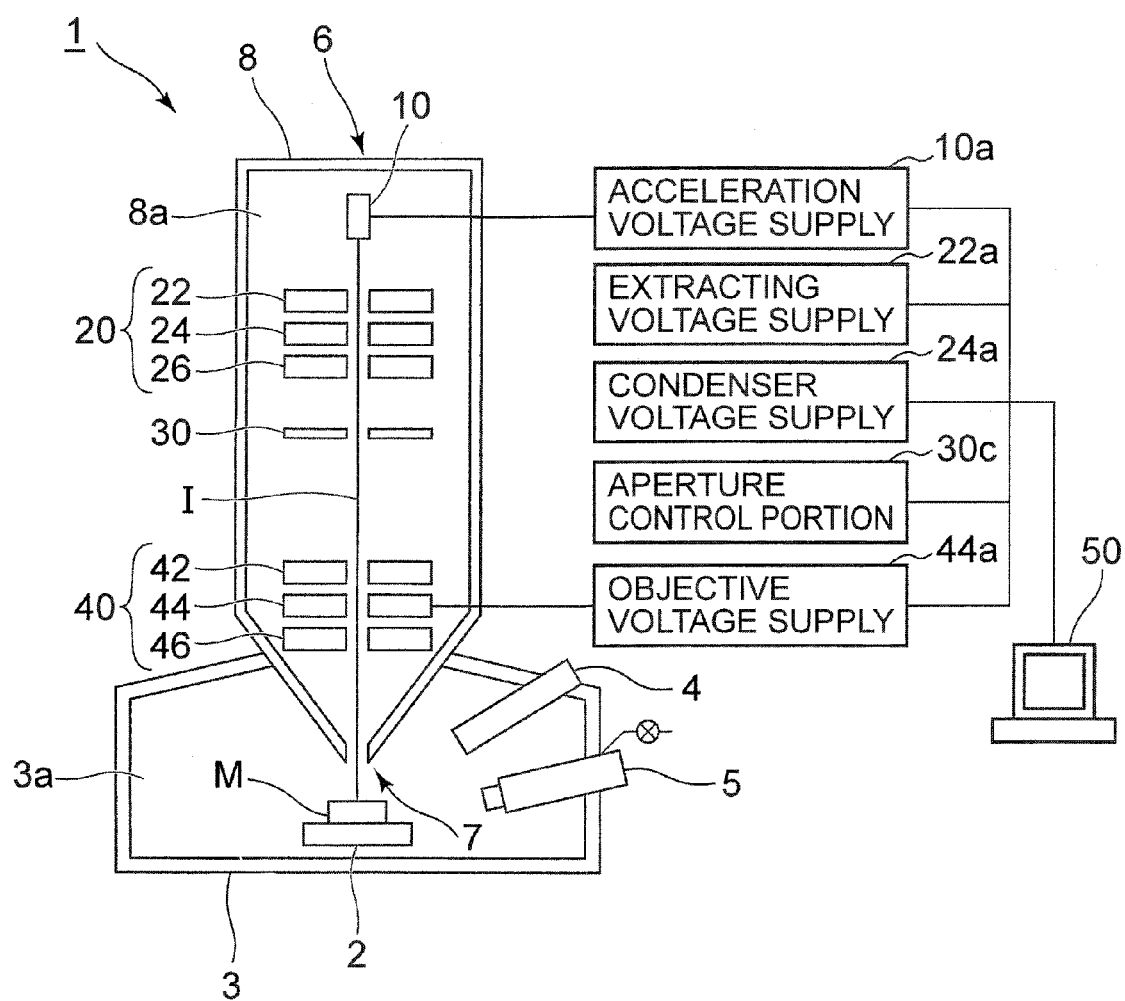
FIG. 1 is a schematic configuration diagram of a focused ion beam apparatus according to an embodiment of the present invention.

FIG. 1 is a schematic configuration diagram of a focused ion beam apparatus according to an embodiment of the present invention. A focused ion beam apparatus 1 as a charged particle beam apparatus irradiates a sample M with an ion beam I as a charged particle beam, to thereby process the surface of the sample M and the like. For example, it is possible to arrange a wafer as the sample M to prepare a sample for transmission electron microscope (TEM) observation, or alternatively, it is possible to set a photomask used in the photolithography technology as the sample M to repair the photomask. In the following, the focused ion beam apparatus 1 according to this embodiment is described in detail.

As illustrated in FIG. 1, the focused ion beam apparatus 1 includes a vacuum chamber 3 in which the sample M is accommodated, and an ion beam column 6 for irradiating the sample M with the ion beam I.

The vacuum chamber 3 is provided with a sample stage 2 on which the sample M is placed, a secondary electron detector 4 for detecting secondary electrons emitted from the sample M, and a gas gun 5 for supplying a processing gas to the surface of the sample M. The sample stage 2 can move the sample M in respective directions by a three-axis stage. Further, the sample stage 2 is provided with a Faraday cup to be used in a condenser voltage setting process described later. The secondary electron detector 4 detects secondary electrons emitted from the sample M by irradiation of the ion beam I, to thereby enable observation of the state of the sample M. The gas gun 5 supplies an etching gas or a deposition gas depending on the contents of processing of the sample M. Note that, the vacuum chamber 3 is connected to a vacuum pump, which is capable of exhausting air to bring an interior 3a into a high-vacuum atmosphere.

The ion beam column 6 includes a cylindrical member 8 provided with an irradiation port 7 at the distal end thereof, which communicates with the vacuum chamber 3. In an interior 8a of the cylindrical member 8, an ion source 10 for supplying ions to generate the ion beam I, and ion beam optics for controlling the state of the ion beam I are arranged in the stated order from the proximal end side to the distal end side of the cylindrical member 8. As the ion beam optics, a condenser lens 20 for condensing the ion beam I, an aperture 30 for reducing the ion beam I, and an objective lens 40 for focusing the ion beam Ito the sample M are arranged in the stated order from the proximal end side to the distal end side of the cylindrical member 8.

The ion source 10 supplies ions such as gallium ions (Ga$^+$). The ion source 10 is connected to an acceleration voltage supply 10a.

The condenser lens (CL) 20 includes three electrodes each having a through hole through which the ion beam I passes, which are arranged along an irradiation path of the ion beam I. As the three electrodes, an incident side electrode 22, an intermediate electrode 24, and an exit side electrode 26 are arranged in the stated order from the proximal end side to the distal end side of the cylindrical member 8.

(Bipotential Lens)

In this embodiment, a bipotential lens is adopted as the condenser lens 20.

Figure 2:
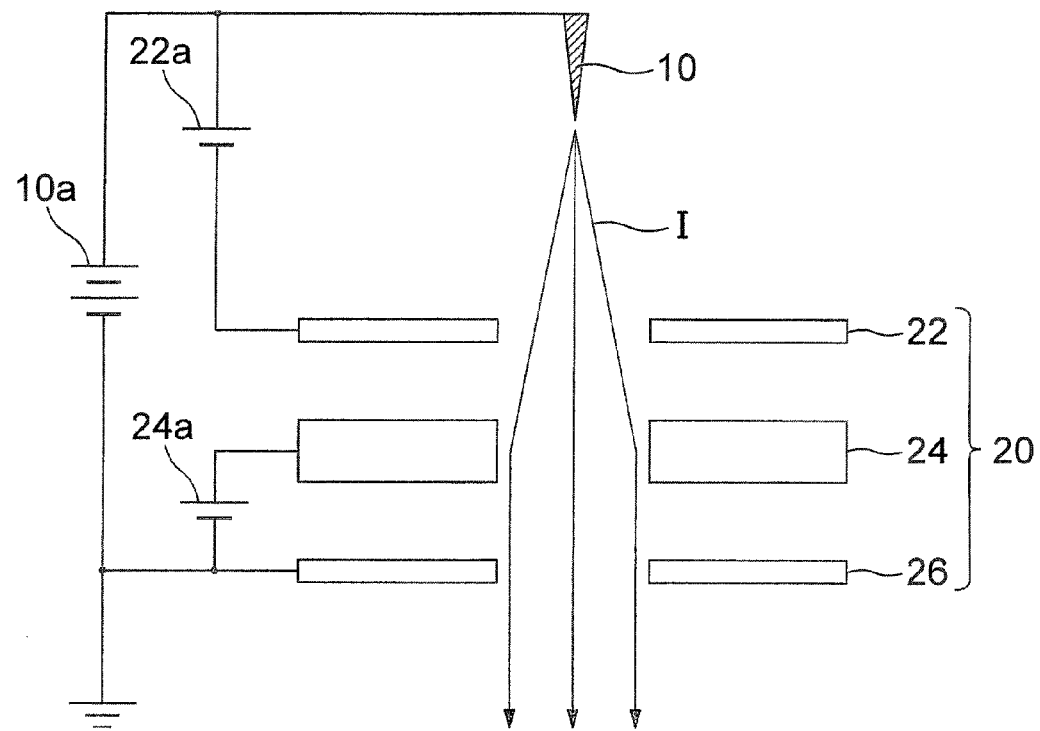
FIG. 2 is an explanatory diagram of a bipotential lens.

FIG. 2 is an explanatory diagram of the bipotential lens. In the bipotential lens, an extracting voltage supply 22a is connected between the ion source 10 and the incident side electrode 22 of the condenser lens 20. The extracting voltage supply 22a applies an extracting voltage, and thus ions can be extracted from the ion source 10 to generate the ion beam I. Further, a condenser voltage supply 24a is connected to the intermediate electrode 24. The condenser voltage supply 24a applies a condenser voltage, and thus the diverging ion beam I can be condensed in a substantially collimated manner. On the other hand, the exit side electrode 26 is grounded. Note that, as described above, the ion source 10 is connected to the acceleration voltage supply 10a. The acceleration voltage supply 10a applies an acceleration voltage, and thus the ion beam I can be accelerated.

Referring back to FIG. 1, the aperture 30 is a flat-plate member having an opening formed at a predetermined aperture diameter. In this embodiment, a plurality of types of apertures 30 having different aperture diameters are provided. Through replacement of the aperture 30, a beam current (ion beam current) and a beam diameter (ion beam diameter) of the ion beam I to be radiated to the sample M can be changed.

The objective lens 40 includes, similarly to the condenser lens 20, three electrodes each having a through hole through which the ion beam I passes, which are arranged along the irradiation path of the ion beam I. As the three electrodes, an incident side electrode 42, an intermediate electrode 44, and an exit side electrode 46 are arranged in the stated order from the proximal end side to the distal end side of the cylindrical member 8. As the objective lens 40, an einzel lens is adopted. In the einzel lens, the incident side electrode 42 and the exit side electrode 46 are grounded, and an objective voltage supply 44a is connected to the intermediate electrode 44. The objective voltage supply 44a applies an objective voltage, and thus the ion beam I can be focused to the sample M.

The focused ion beam apparatus 1 includes a control terminal 50 such as a personal computer. The control terminal 50 controls operations of respective portions of the focused ion beam apparatus 1.

The processing rate and the processing accuracy of the sample M depend on, for example, the beam current and the beam diameter of the ion beam I. The beam current and the beam diameter of the ion beam I are determined based on the aperture diameter of the aperture 30, the amount of the condenser voltage, and the like. In view of this, the control terminal 50 controls, based on the instruction from the operator, an aperture control portion 30c to select the type (aperture diameter) of the aperture 30, and controls the condenser voltage supply 24a to set the condenser voltage.

Figure 3:
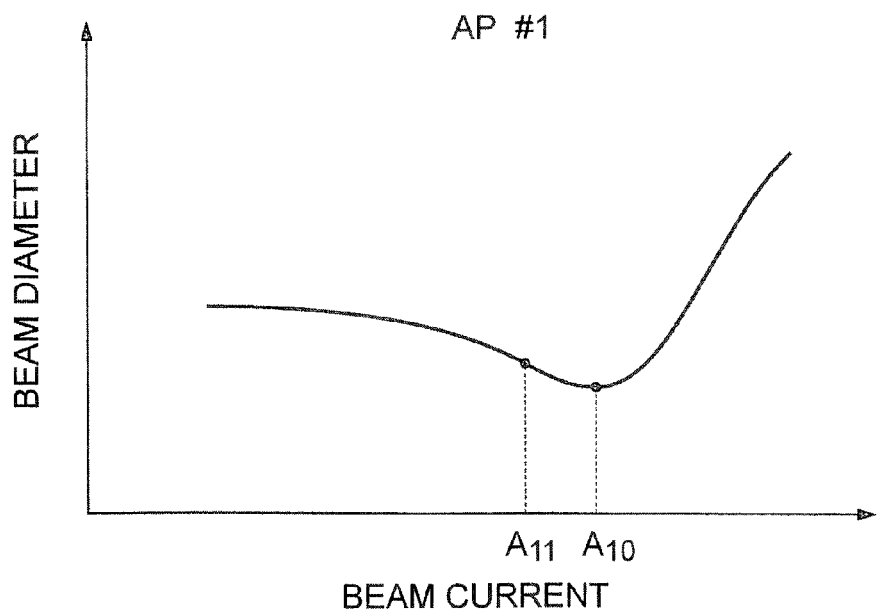
FIG. 3 is a graph showing a relationship between a beam current and a beam diameter.

FIG. 3 is a graph showing a relationship between the beam current and the beam diameter. When the type of the aperture 30 is selected and the amount of the condenser voltage is changed, the beam current increases as the absolute value of the condenser voltage increases, and the beam diameter is minimized at a certain beam current. For example, in FIG. 3, when an aperture #1 (described later) is selected as the aperture (AP), the beam diameter is minimized at a beam current A10. As described above, the focused ion beam apparatus 1 is generally used at a reference beam current at which the beam diameter is minimized.

Note that, the ion beam I having a large beam current may scatter the processing gas supplied from the gas gun 5, which may cause insufficiency in gas assist effect. To address this problem, the focused ion beam apparatus 1 may be used under a state in which the user sets a beam current (for example, A11 of FIG. 3) that is smaller than the reference beam current (for example, A10 of FIG. 3) at which the beam diameter is minimized.

By the way, the ion source 10 and the condenser lens 20 deteriorate with a long term use, and hence periodic replacement of those members is required. When at least one of the ion source 10 and the condenser lens 20 is replaced, the distance between both the members changes. Note that, even before replacement of the ion source 10, the needle tip shape of the ion source 10 may change due to a long term use, and thus the distance between both the members may change. The generation of the ion beam I may become unstable due to this change of the distance between both the members. In order to stabilize the generation of the ion beam I, it is necessary to change the extracting voltage in accordance with the distance between both the members. In view of this, the control terminal 50 controls the extracting voltage supply 22a to set the extracting voltage.

However, this embodiment adopts the bipotential lens as the condenser lens 20. The incident side electrode 22 of the bipotential lens not only functions as the extracting electrode, but also functions as a part of the condenser lens 20. Therefore, when the extracting voltage is changed, the lens electric field is also changed, which causes change in the focused state of the ion beam I. As a result, the beam current of the ion beam I is changed. In order to obtain a desired beam current, it is necessary to set the condenser voltage for each extracting voltage amount and each type of the aperture, respectively.

The control terminal 50 of this embodiment includes a condenser voltage table for setting the condenser voltage. The condenser voltage table stores a setting value of the condenser voltage for each extracting voltage amount and each type of the aperture. In the following, the condenser voltage table is described in detail.

(Condenser Voltage Table)

Figures 4, 5:
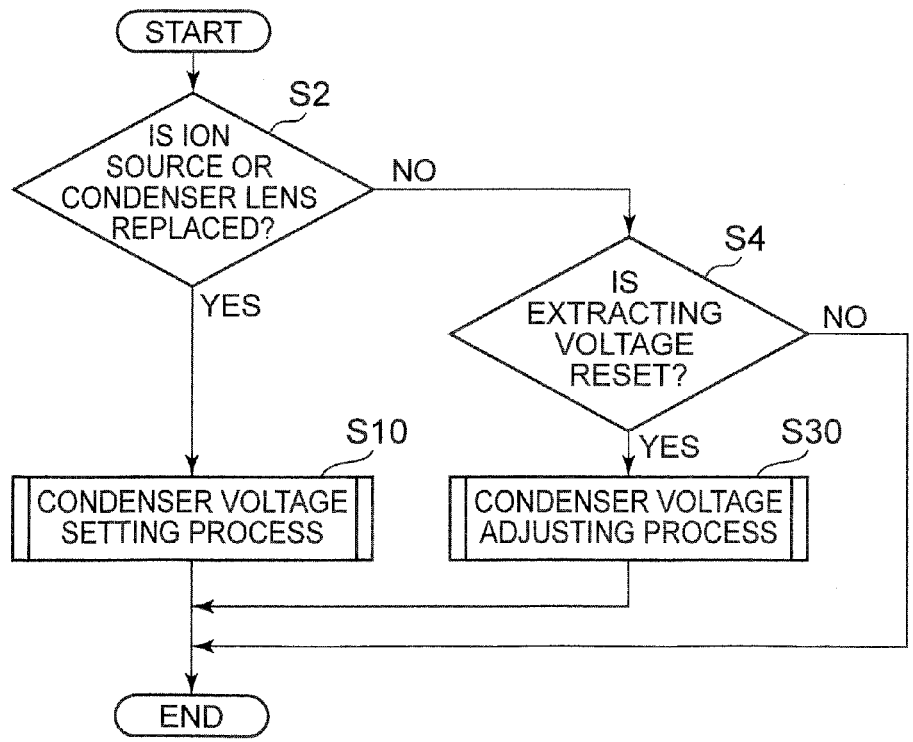
FIG. 4 is an explanatory diagram of a condenser voltage table of the first embodiment.
FIG. 5 is a flow chart of a method of adjusting ion beam optics according to the first embodiment.

FIG. 4 is an explanatory diagram of the condenser voltage table. The condenser voltage table stores cases for each extracting voltage. For example, in the condenser voltage table of FIG. 4, cases where the extracting voltages are 6.9 kV and 7.0 kV are stored. The condenser voltage table stores, for each extracting voltage, a calculation value, a setting value, and a correction value of the condenser voltage for each of apertures (AP) #1 to #5.

As the types of the apertures 30, all apertures 30 included in the focused ion beam apparatus 1 are stored. For example, in FIG. 4, five types of apertures from #1 to #5 are stored in the order of the aperture diameter from the largest. For each of the apertures 30, a reference beam current at which the beam diameter is minimized is stored. For example, in FIG. 4, A10 described above is stored as the reference beam current of the aperture #1.

The calculation value of the condenser voltage is obtained in advance by a calculation formula as a condenser voltage for obtaining a reference beam current in specific extracting voltage and aperture 30. The setting value of the condenser voltage is a condenser voltage that is supposed to be set in the actual apparatus so that the reference beam current is obtainable in the specific extracting voltage and aperture 30. In general, the distance between the ion source 10 and the condenser lens 20 is deviated from the design value due to the dimension error. Therefore, the setting value is deviated from the calculation value of the condenser voltage. Further, also when the condenser lens control signal is offset, the setting value is deviated from the calculation value of the condenser voltage. The correction value of the condenser voltage is a difference between the calculation value and the setting value (deviation amount). For example, in FIG. 4, as for the aperture

1 when the extracting voltage is 6.9 kV, the calculation value of −17.9 kV, the setting value of −17.53 kV, and the correction value of 0.37 kV are stored.

When at least one of the ion source 10 and the condenser lens 20 is replaced, the control terminal 50 illustrated in FIG. 1 performs the condenser voltage setting process described later to update the above-mentioned condenser voltage table and set the condenser voltage. Further, when the extracting voltage is reset, the control terminal 50 performs a condenser voltage adjusting process described later to reset the condenser voltage. Note that, a memory of the control terminal 50 stores programs for performing the condenser voltage setting process and the condenser voltage adjusting process. Through execution of those programs, the condenser voltage setting process and the condenser voltage adjusting process are performed. In the following, a method of adjusting ion beam optics, which includes the condenser voltage setting process and the condenser voltage adjusting process, is described.

(Method of Adjusting Ion Beam Optics)

FIG. 5 is a flow chart of a method of adjusting ion beam optics according to the first embodiment.

Figure 6A:
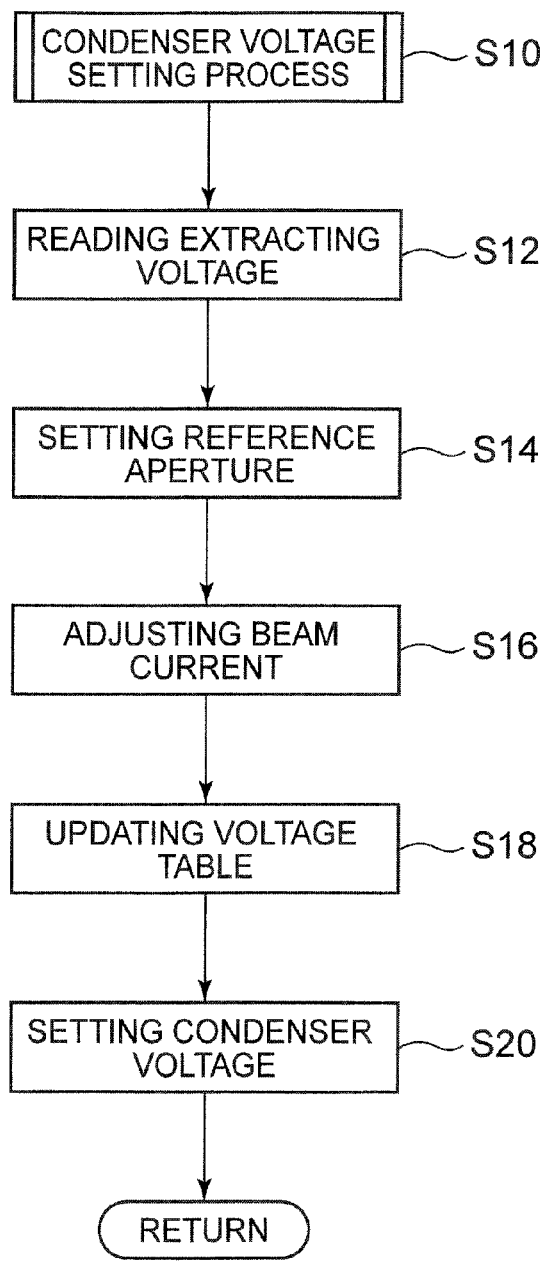
FIG. 6A is a flow chart of a condenser voltage setting process subroutine.
Figure 6B:
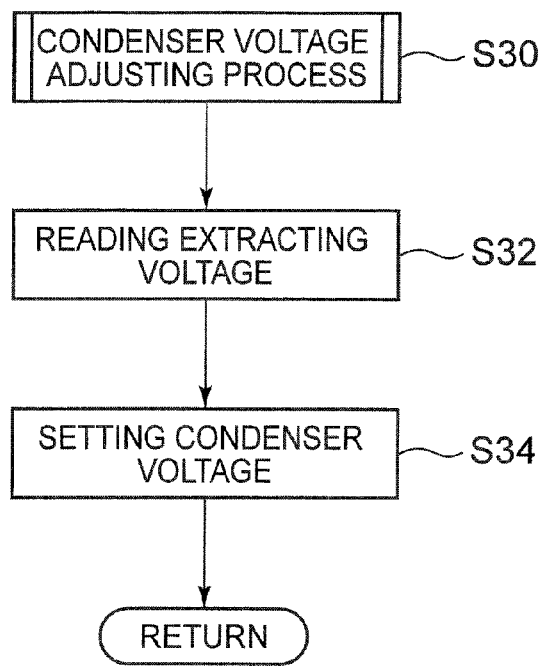
FIG. 6B is a flow chart of a condenser voltage adjusting process subroutine.

FIG. 6A is a flow chart of the condenser voltage setting process subroutine, and FIG. 6B is a flow chart of the condenser voltage adjusting process subroutine.

Figure 7:
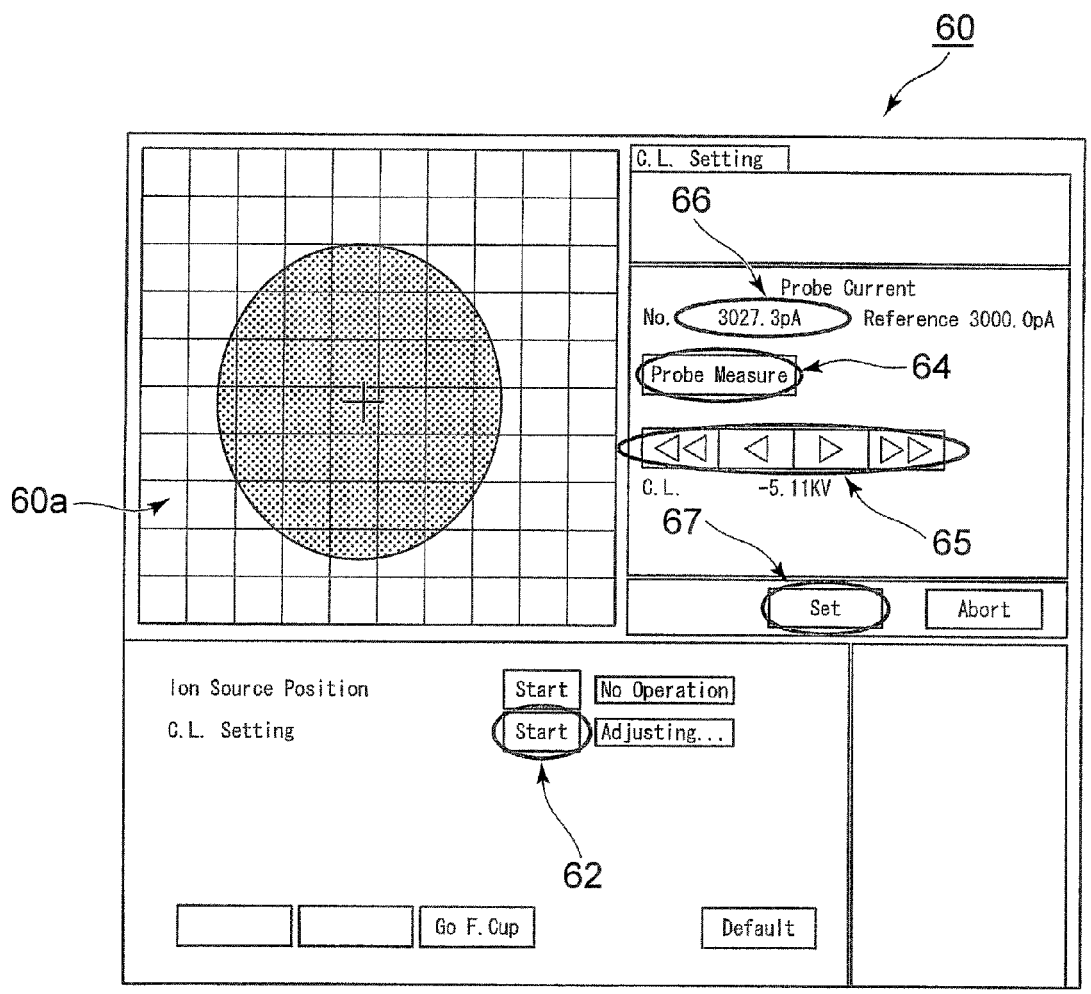
FIG. 7 illustrates a display screen of a control terminal in the condenser voltage setting process.
Figures 8, 9:
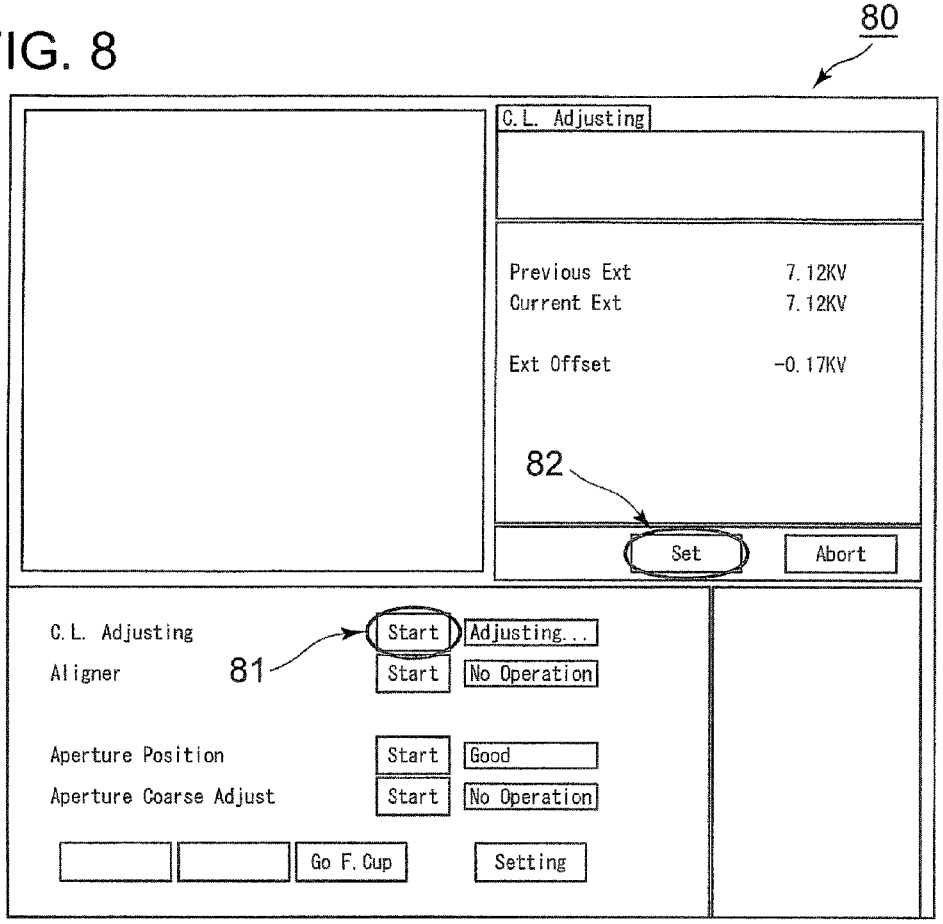
FIG. 8 illustrates a display screen of the control terminal in the condenser voltage adjusting process.
FIG. 9 is an explanatory diagram of a condenser voltage table of a second embodiment of the present invention.

FIG. 7 illustrates a display screen of the control terminal in the condenser voltage setting process, and FIG. 8 illustrates a display screen of the control terminal in the condenser voltage adjusting process.

In FIG. 5, whether at least one of the ion source 10 and the condenser lens 20 has been replaced is determined (S2). When determination of S2 is Yes, there is a high possibility that the distance between the ion source 10 and the condenser lens 20 has changed from before. In this case, the deviation amount of the setting value from the calculation value of the condenser voltage has also changed from before. Therefore, in order to update the condenser voltage table and reset the condenser voltage, the process proceeds to S10 to perform the condenser voltage setting process.

(Condenser Voltage Setting Process)

The condenser voltage setting process (S10) illustrated in FIG. 6A starts by executing the condenser voltage setting process program stored in the memory of the control terminal 50.

When the condenser voltage setting process program is executed, a screen 60 of FIG. 7 is displayed on the display of the control terminal 50. When a start button 62 is pressed in the screen, the sample stage 2 of the focused ion beam apparatus 1 is moved so that the Faraday cup formed in the sample stage 2 is arranged to be opposed to the irradiation port 7 of the ion beam column 6. In a monitor portion 60a of the screen, a scanning ion microscope image near the Faraday cup is displayed.

Further, in association with the pressing of the start button 62 in the screen, the control terminal 50 reads the value of the extracting voltage (S 12). In the following, a case where the extracting voltage is 6.9 kV is described as an example. Further, the control terminal 50 selects and sets a reference aperture (S14). Any one of the apertures can be set as the reference aperture, but in the following, a case where the aperture #1 is selected is described as an example. In this case, the reference beam current at which the beam diameter is minimized is A10 (see FIGS. 3 and 4).

Next, the beam current is adjusted (S 16). Specifically, a measurement button 64 is pressed in the screen illustrated in FIG. 7. With this, the ion beam I is radiated from the ion beam column 6 toward the Faraday cup, and the beam current is measured by the Faraday cup. The measured beam current is displayed on a beam current display portion 66 in the screen. A condenser voltage adjustment button 65 is provided in the screen. The operator of the focused ion beam apparatus 1 increases and reduces the condenser voltage with use of the condenser voltage adjustment button 65, to thereby adjust the beam current. In this embodiment, the beam current is caused to substantially match with the reference beam current A10. Note that, on the monitor portion 60a in the screen, a scanning ion microscope image near the Faraday cup is displayed.

Next, the condenser voltage table is updated (or newly created) (S18). Specifically, a setting button 67 is pressed in the screen. Then, a condenser voltage at a time point at which the beam current substantially matches with the reference beam current A10 is stored as an experimental value of the condenser voltage.

In the condenser voltage table illustrated in FIG. 4, the calculation value of the condenser voltage for each extracting voltage and each aperture 30 is stored in advance. For example, when the extracting voltage is 6.9 kV and the aperture #1 is used, -17.9 kV is stored as the calculation value of the condenser voltage. Through pressing of the setting button 67 in the screen, −17.53 kV is stored in the column of the setting value as the experimental value of the condenser voltage. Simultaneously, the calculation value is subtracted from the experimental value of the condenser voltage, and 0.37 kV is stored as the correction value of the condenser voltage.

The deviation of the setting value from the calculation value of the condenser voltage occurs due to, for example, deviation of the distance between the ion source 10 and the condenser lens 20 from the design value due to the dimension error, or offset of the condenser lens control signal. The dimension error between the ion source 10 and the condenser lens 20 and the offset of the control signal are constant regardless of the type of the aperture 30, and hence the correction value as the deviation amount of the setting value from the calculation value of the condenser voltage is also constant regardless of the type of the aperture 30. Therefore, in the condenser voltage table illustrated in FIG. 4, as for all of the apertures #1 to #5 in the extracting voltage of 6.9 kV, 0.37 is stored as the correction value of the condenser voltage. Further, in this embodiment, as for all of the apertures #1 to #5 in other extracting voltages (for example, 7.0 kV), 0.37 is stored as the correction value of the condenser voltage as well. Thus, as for all of the extracting voltages and all of the apertures 30, the correction value is added to the calculation value of the condenser voltage to obtain the setting value of the condenser voltage, and the obtained setting value is stored in the condenser voltage table. In this manner, the condenser voltage table is updated.

Next, the condenser voltage for each aperture 30 is set (S20). Specifically, the aperture 30 and the setting value of the condenser voltage are associated with each other so that the condenser voltage is automatically set when the aperture 30 is replaced.

In this manner, the condenser voltage setting process is ended.

Referring back to FIG. 5, when the determination of S2 is No, the process proceeds to S4, and whether the extracting voltage has been reset is determined (S4). When the ion source 10 is used for a long period of time and generation of the ion beam I becomes unstable, it is necessary to reset the extracting voltage in order to stabilize the generation of the ion beam I. When the extracting voltage is reset, the amount of the condenser voltage for obtaining the reference beam current also changes. Therefore, in order to adjust the condenser voltage, the process proceeds to S30 to perform the condenser voltage adjusting process.

(Condenser Voltage Adjusting Process)

The condenser voltage adjusting process (S30) starts by executing the condenser voltage adjusting process program stored in the memory of the control terminal 50.

When the condenser voltage adjusting process program is executed, a screen 80 of FIG. 8 is displayed on the display of the control terminal 50. When a start button 81 is pressed in the screen, the control terminal 50 reads the value of the extracting voltage (S32). Next, when a setting button 82 is pressed in the screen, the control terminal 50 resets the condenser voltage of each aperture 30 (S34). Specifically, the control terminal 50 refers to the condenser voltage table, and reads the setting value of the condenser voltage, which corresponds to each aperture 30 of the extracting voltage. Then, the aperture 30 and the setting value of the condenser voltage are associated with each other so that the condenser voltage is automatically set when the aperture 30 is replaced.

In this manner, the condenser voltage adjusting process is ended.

As described in detail above, in this embodiment, when the condenser voltage table of FIG. 4 is created, as for all of the apertures #1 to #5, the calculation values of the condenser voltage for obtaining the reference beam currents A10 to A50 are stored in the condenser voltage table in advance, and as for the reference aperture #1, the experimental value of the condenser voltage for obtaining the reference beam current A10 is obtained. Then, the calculation value stored for the reference aperture #1 is subtracted from the experimental value, to thereby obtain the correction value of the condenser voltage. Then, the correction value is added to each of the calculation values stored for all of the apertures #1 to #5, to thereby obtain the setting values of the condenser voltage and store the obtained setting values in the condenser voltage table.

The deviation of the experimental value from the calculation value of the condenser voltage occurs due to, for example, deviation of the distance between the ion source 10 and the condenser lens 20 from the design value due to the dimension error, or offset of the condenser lens control signal. The dimension error between the ion source 10 and the condenser lens 20 and the offset of the control signal are constant regardless of the type of the aperture 30, and hence the correction value as the deviation amount between the experimental value and the calculation value of the condenser voltage is also constant regardless of the type of the aperture 30.

Therefore, the correction value is added to each of the calculation values stored for all of the apertures #1 to #5, to thereby obtain the setting values of the condenser voltage and store the obtained setting values in the condenser voltage table. With this, merely by obtaining the experimental value of the condenser voltage for obtaining the reference beam current A10 for only the reference aperture #1, the setting values of the condenser voltage for other apertures can be obtained. Therefore, the condenser voltage table can be easily created with high accuracy. Through setting of the condenser voltage based on this condenser voltage table, the condenser voltage can be easily set with high accuracy. Note that, as compared to the case where the calculation value of the condenser voltage is set as the setting value as it is, this embodiment can obtain the reference beam current with higher accuracy because the correction value is obtained from the experimental value of the condenser voltage and then the setting value is calculated.

Further, in this embodiment, when the condenser voltage table of FIG. 4 is created, a correction value obtained for the reference aperture #1 in a specific extracting voltage is added to each of the calculation values stored for all of the apertures #1 to #5 in extracting voltages different from the specific extracting voltage, to thereby obtain the setting values of the condenser voltages and store the obtained setting values in the condenser voltage table.

In this manner, merely by obtaining the experimental value of the condenser voltage for only the reference aperture #1 in the specific extracting voltage, the setting values of the condenser voltages for all of the apertures #1 to #5 in all of the extracting voltages can be obtained. Therefore, the condenser voltage table can be created very easily.

(Second Embodiment)

Next, a focused ion beam apparatus and a method of adjusting ion beam optics according to a second embodiment of the present invention are described.

In the first embodiment, a correction value obtained in a specific extracting voltage is added to a calculation value stored in a different extracting voltage, to thereby obtain the setting value of the condenser voltage. The second embodiment differs from the first embodiment in that the correction value obtained for each extracting voltage is added to the calculation value stored for each extracting voltage, to thereby obtain the setting value of the condenser voltage. Note that, detailed description of parts having configurations similar to those of the first embodiment is omitted.

As described in the first embodiment, when the ion source 10 is used for a long period of time and generation of the ion beam I becomes unstable, it is necessary to reset the extracting voltage in order to stabilize the generation of the ion beam I. In the case where the ion beam I is generated unstably, it is considered that the needle tip shape of the ion source 10 has changed due to a long term use. In this case, it is considered that the distance between the ion source 10 and the condenser lens 20 has changed from before, and hence the deviation amount of the setting value from the calculation value of the condenser voltage (amount of correction value) has also changed from before. Note that, the change of the needle tip shape of the ion source 10 due to the long term use is small, and hence in the first embodiment, the change amount of the correction value is deemed to be sufficiently small, and the same correction value is applied to all of the extracting voltages to obtain the setting values of the condenser voltages. In the second embodiment, on the other hand, the change amount of the correction value is strictly determined, and correction values that differ for each extracting voltage are applied to obtain the setting values of the condenser voltages.

In the condenser voltage table of the first embodiment illustrated in FIG. 4, in both cases of the extracting voltages of 6.9 kV and 7.0 kV, 0.37 kV is applied as the correction value.

FIG. 9 is an explanatory diagram of a condenser voltage table of the second embodiment. In the condenser voltage table of the second embodiment, when the extracting voltage is 6.9 kV, 0.37 kV is applied as the correction value, and when the extracting voltage is 7.0 kV, 0.4 kV is applied as the correction value.

Figure 10:
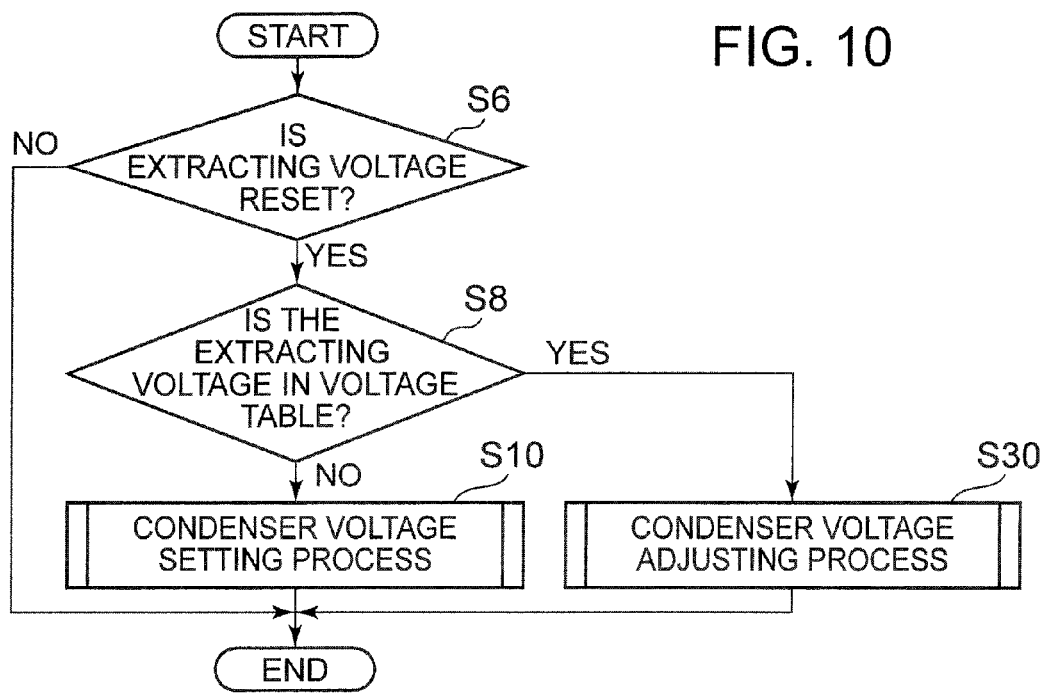
FIG. 10 is a flow chart of a method of adjusting ion beam optics according to the second embodiment.

FIG. 10 is a flow chart of the method of adjusting ion beam optics according to the second embodiment. First, in S6, whether the extracting voltage has been reset is determined. When the determination of S6 is No, it is unnecessary to reset the condenser voltage, and hence the process is ended. Note that, when the ion source 10 or the condenser lens 20 is replaced, the extracting voltage is obviously reset, and hence the determination of S6 is Yes. When the determination of S6 is Yes, the process proceeds to S8.

In S8, it is determined whether the setting value of the condenser voltage in the extracting voltage that has been reset is already stored in the condenser voltage table. Note that, when the ion source 10 or the condenser lens 20 is replaced, the condenser voltage table needs to be updated, and hence the determination of S8 is No. When the determination of S8 is No, it is necessary to obtain the setting values of the condenser voltage in that extracting voltage, and hence the process proceeds to S10 to perform the condenser voltage setting process.

The condenser voltage setting process illustrated in FIG. 6A is performed with use of the screen of FIG. 7 similarly to the first embodiment. First, the value of the extracting voltage is read (S 12). In the following, a case where the extracting voltage is 7.0 kV is described as an example. Next, the reference aperture is selected and set (S14). In the following, a case where the aperture #1 is selected is described as an example. In the condenser voltage table illustrated in FIG. 9, the calculation values of the condenser voltages for all of the extracting voltages and all of the apertures 30 are stored in advance. For example, in FIG. 9, as for the aperture #1 in the extracting voltage of 7.0 kV, -18.5 kV is stored as the calculation value.

Next, the beam current is adjusted (S 16), and the condenser voltage table is updated (S18). With this, as for the aperture #1 in the extracting voltage of 7.0 kV, −18.1 kV is stored in the column of the setting value as the experimental value of the condenser voltage. Simultaneously, the calculation value is subtracted from the experimental value, and 0.4 kV is stored as the correction value of the condenser voltage. Next, only with respect to the extracting voltage of 7.0 kV in the condenser voltage table, 0.4 kV is stored as the correction value for all of the apertures #1 to #5. Next, only with respect to the extracting voltage of 7.0 kV, as for all of the apertures #1 to #5, the correction value is added to the calculation values to obtain the setting values of the condenser voltage, and the obtained setting values are stored in the condenser voltage table. In this manner, the condenser voltage table is updated. After that, the condenser voltage of each aperture 30 is set (S20), and the condenser voltage setting process is ended.

Referring back to FIG. 10, when the determination of S8 is Yes, it is possible to reset the condenser voltage with reference to the condenser voltage table, and hence the process proceeds to S30 to perform the condenser voltage adjusting process. The specific contents of the condenser voltage adjusting process are similar to those of the first embodiment.

As described in detail above, in this embodiment, the control terminal 50 obtains the experimental value of the reference aperture #1 for each extracting voltage, and the calculation value stored for the reference aperture #1 is subtracted from the experimental value for each extracting voltage to obtain the correction value. Then, the correction value is added to each of the calculation values stored for all of the apertures #1 to #5 for each extracting voltage, to thereby obtain the setting values of the condenser voltages.

With this, even when the needle tip shape of the ion source 10 has changed due to the long term use to change the distance between the ion source and the condenser lens, the condenser voltage table can be created with high accuracy by obtaining the correction value for each extracting voltage and then calculating the setting value of the condenser voltage.

(Third Embodiment)

Next, a focused ion beam apparatus and a method of adjusting ion beam optics according to a third embodiment of the present invention are described.

The condenser voltage tables of the first and second embodiments store only the setting value of the condenser voltage for obtaining the reference beam current. The third embodiment differs from those embodiments in that, in addition thereto, the condenser voltage table stores a setting value of the condenser voltage for obtaining an arbitrary beam current. Note that, detailed description of parts having configurations similar to those of the first and second embodiments is omitted.

As described in the first embodiment, the focused ion beam apparatus 1 generally uses the reference beam current at which the beam diameter is minimized. However, the ion beam I having a large beam current may scatter the processing gas supplied from the gas gun 5, which may cause insufficiency in gas assist effect. To address this problem, the focused ion beam apparatus 1 may be used under a state in which the user sets an arbitrary beam current (for example, A11 of FIG. 3) that is smaller than the reference beam current (for example, A10 of FIG. 3). In view of this, the condenser voltage table of the third embodiment stores, in addition to the setting value of the condenser voltage for obtaining the reference beam current, a setting value of the condenser voltage for obtaining an arbitrary beam current.

FIGS. 11A and 11B are explanatory diagrams of the condenser voltage tables of the third embodiment. In the third embodiment, a combination of the ion source 10 and the condenser lens 20 before replacement is referred to as "first set", and a combination of the ion source 10 and the condenser lens 20 after at least one of those members is replaced is referred to as "second set". FIG. 11A illustrates a first condenser voltage table relating to the first set, and FIG. 11B illustrates a second condenser voltage table relating to the second set.

Each of the condenser voltage tables of FIGS. 11A and 11B stores, for example, as for the aperture #1 in the extracting voltage of 6.9 kV, respective values (calculation value, setting value, and correction value) of the condenser voltage. In this case, in addition to respective values of the condenser voltage for obtaining the reference beam current A10, respective values of the condenser voltage for obtaining arbitrary beam currents A11 and A12 are stored.

In the first condenser voltage table illustrated in FIG. 11A, 0.37 kV is stored as the correction value of the condenser voltage for all of the beam currents. On the other hand, in the second condenser voltage table illustrated in FIG. 11B, 0.39 kV is stored as the correction value of the condenser voltage for all of the beam currents.

Figure 12:
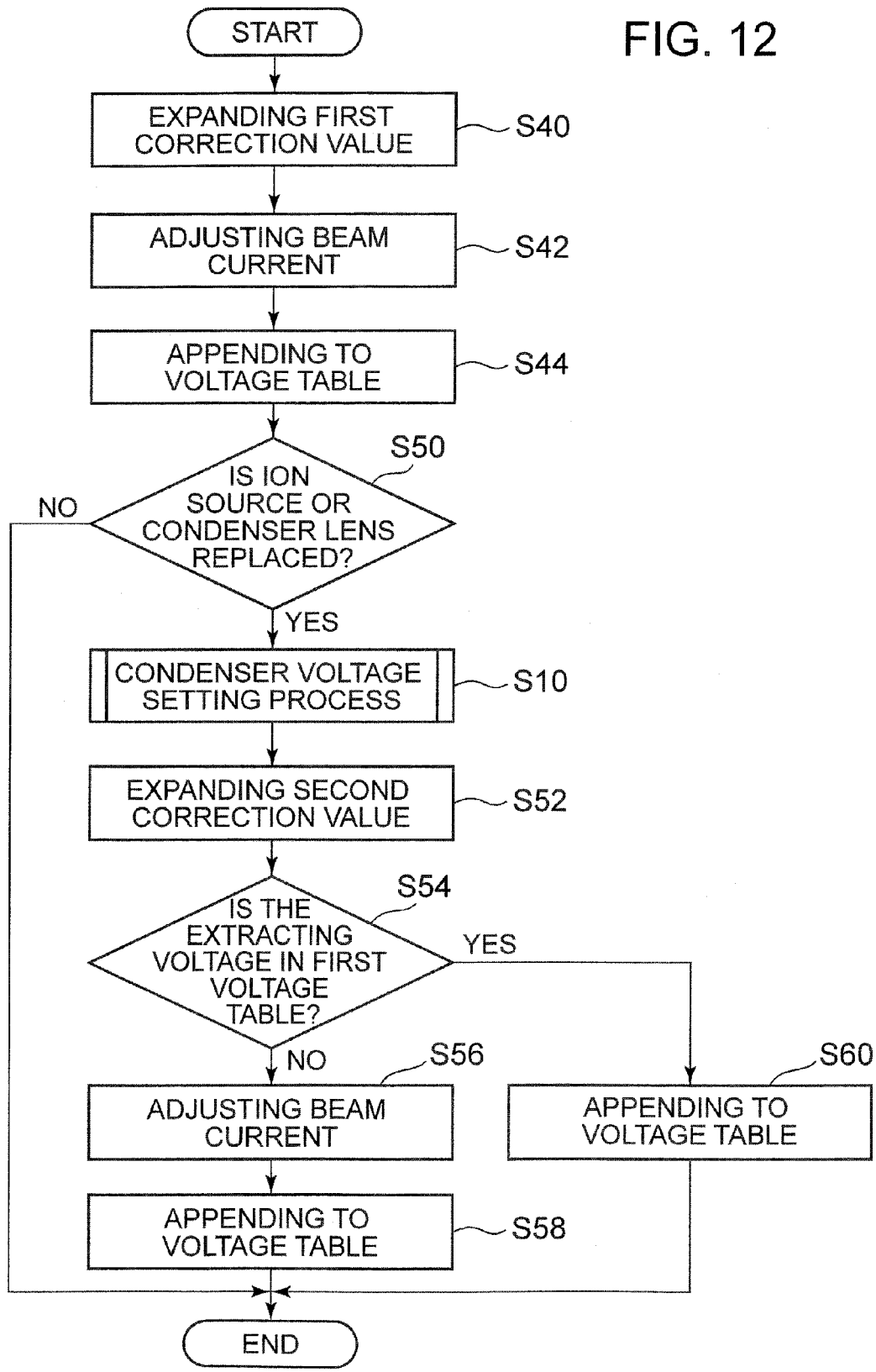
FIG. 12 is a flow chart of a method of adjusting ion beam optics according to the third embodiment.

FIG. 12 is a flow chart of the method of adjusting ion beam optics according to the third embodiment. In the following, description is given of a case where an arbitrary setting value of the condenser voltage for obtaining the arbitrary beam current A11 is obtained as an example.

In the third embodiment, the first condenser voltage table illustrated in FIG. 11A starts from a state in which only the respective values of the condenser voltage for obtaining the reference beam current A10 are stored, and the respective values of the condenser voltage for obtaining the arbitrary beam current A11 are not stored. Regarding the first set, the correction value of the condenser voltage in a case where the reference beam current A10 is obtained is referred to as "first correction value". For example, in the first condenser voltage table of FIG. 11A, 0.37 kV is stored as the first correction value.

As described in the first embodiment, the deviation amount of the setting value from the calculation value of the condenser voltage (amount of the correction value) corresponds to the amount of deviation of the distance between the ion source 10 and the condenser lens 20 from the design value due to the dimension error. The distance between the ion source 10 and the condenser lens 20 is constant regardless of the beam current, and hence the correction value of the condenser voltage is also constant regardless of the beam current. That is, the first correction value in the case where the reference beam current A10 is obtained matches with the correction value in the case where the arbitrary beam current A11 is obtained. Therefore, the first correction value in the case where the reference beam current A 10 is obtained is expanded as the correction value in the case where the arbitrary beam current A11 is obtained, and the expanded correction value is stored in the first condenser voltage table (S40).

As described in the first embodiment, the calculation value of the condenser voltage for obtaining the reference beam current A10 can be calculated from a calculation formula. On the other hand, it is difficult to obtain the calculation value of the condenser voltage for obtaining the arbitrary beam current A11 from a calculation formula. Therefore, it is difficult to create a condenser voltage table in the same way as the first and second embodiments. First, it is necessary to accumulate data on the condenser voltage for obtaining the arbitrary beam current A11.

In view of this, in the third embodiment, the beam current is adjusted again (S42). Specifically, similarly to the beam current adjustment (S16) in the condenser voltage setting process, the operator of the focused ion beam apparatus 1 increases or decreases the condenser voltage with use of the condenser voltage adjustment button 65 in the screen of FIG. 7, to thereby adjust the beam current. In this manner, in the third embodiment, the beam current is caused to substantially match with the arbitrary beam current A11.

Next, appending to the first condenser voltage table is performed (S44). Specifically, the setting button 67 is pressed in the screen of FIG. 7. Then, a condenser voltage at a time point at which the beam current substantially matches with the arbitrary beam current A11 is stored as a first experimental value of the condenser voltage in the column of the setting value in the first condenser voltage table. For example, in FIG. 11A, −17.51 kV is stored as the first experimental value. Next, the first correction value is subtracted from the first experimental value, and the first calculation value of the condenser voltage for obtaining the arbitrary beam current A11 is calculated backwards, to thereby store the calculated first calculation value in the first condenser voltage table. For example, in FIG. 11A, −17.88 kV is stored as the first calculation value. In this manner, the first condenser voltage table is completed.

Referring back to FIG. 12, after that, whether at least one of the ion source 10 and the condenser lens 20 has been replaced is determined (S50). When the determination of S50 is No, the process is ended. When the determination of S50 is Yes, it is necessary to update the condenser voltage table, and hence the process proceeds to S10 to perform the condenser voltage setting process. With the condenser voltage setting process of S10, the second condenser voltage table illustrated in FIG. 11B becomes a state in which the respective values of the condenser voltage for obtaining the reference beam current A10 are stored. In this case, regarding the second set, the correction value of the condenser voltage in a case where the reference beam current A 10 is obtained is referred to as "second correction value". For example, in the second condenser voltage table of FIG. 11B, 0.39 kV is stored as the second correction value.

Next, the second correction value in the case where the reference beam current A10 is obtained is expanded as the correction value in the case where the arbitrary beam current A11 is obtained, and the expanded correction value is stored in the second condenser voltage table (S52).

In a case where at least one of the ion source 10 and the condenser lens 20 has been replaced, the extracting voltage has been reset. Therefore, it is determined whether respective values of the condenser voltage for obtaining the arbitrary beam current A11 in the extracting voltage that has been reset are stored in the first condenser voltage table before replacement (S54). When the determination of S54 is No, similarly to the case of the first set, it is necessary to accumulate data on the condenser voltage for obtaining the arbitrary beam current. Therefore, similarly to S42, the beam current is adjusted (S56), and similarly to S58, appending to the second condenser voltage table is performed (S58). Then, the process is ended.

On the other hand, when the determination of S54 is Yes, appending to the second condenser voltage table is immediately performed (S60). When the determination of S54 is Yes, the first calculation value of the condenser voltage for obtaining the arbitrary beam current A11 in the extracting voltage that has been reset is stored in the first condenser voltage table before replacement. This first calculation value of the condenser voltage functions as the calculation value of the condenser voltage for obtaining the arbitrary beam current A11 if the extracting voltage is the same even after the replacement to the second set. Therefore, the first calculation value is stored in the second condenser voltage table as the calculation value of the condenser voltage for obtaining the arbitrary beam current A11. For example, in FIG. 11B, as the calculation value of the condenser voltage for obtaining the arbitrary beam current A11, the first calculation value of −17.88 kV is stored. Further, the second correction value is added to the first calculation value, to thereby obtain an arbitrary setting value of the condenser voltage for obtaining the arbitrary beam current A11 and store the obtained arbitrary setting value in the second condenser voltage table. For example, in FIG. 11B, −17.49 kV is stored as the arbitrary setting value of the condenser voltage.

In this manner, the second condenser voltage table is completed.

As described in detail above, in this embodiment, after the first correction value is obtained for the first set of the ion source 10 and the condenser lens 20, the first experimental value of the condenser voltage for obtaining the arbitrary beam current A11 is obtained, and the first correction value is subtracted from the first experimental value to obtain the first calculation value of the condenser voltage for obtaining the arbitrary beam current A11. Then, the second correction value is obtained for the second set in which at least one of the ion source 10 and the condenser lens 20 is different from those of the first set, and the second correction value is added to the first calculation value to obtain the arbitrary setting value of the condenser voltage for obtaining the arbitrary beam current A11.

With this, the arbitrary setting value of the condenser voltage for obtaining the arbitrary beam current A11 is efficiently obtained, and thus the condenser voltage table can be easily created.

Note that, the technical scope of the present invention is not limited to the above-mentioned embodiments, and encompasses various modifications made to the above-mentioned embodiments without departing from the gist of the present invention. That is, the specific materials and layer configurations exemplified in the embodiments are merely examples, and modifications can be made thereto as appropriate.

For example, various components can be added to the focused ion beam apparatus of each embodiment, if necessary.

The present invention provides illustrative, non-limiting aspects as follows:

According to an aspect of the present invention, there is provided a focused ion beam apparatus including: an ion source configured to supply ions; a condenser lens configured to condense an ion beam extracted from the ion source, the condenser lens including a bipotential lens including: a first electrode configured to extract the ion beam from the ion source in response to application of an extracting voltage between the first electrode and the ion source, and a second electrode configured to condense the ion beam extracted from the ion source in response to application of a condenser voltage between the second electrode and the ion source; a plurality of types of apertures having different aperture diameters and configured to reduce a diameter of the condensed ion beam; and a control portion including a condenser voltage table configured to store a setting value of the condenser voltage for obtaining a reference ion beam current at which the ion beam diameter is minimized in correspondence with an amount of the extracting voltage and the types of the apertures and being configured to set the condenser voltage based on the condenser voltage table, wherein the control portion is configured to: store in advance, in the condenser voltage table, a calculation value of the condenser voltage for obtaining the reference ion beam current for each of the plurality of types of the apertures, obtain, for a reference aperture among the plurality of types of the apertures, an experimental value of the condenser voltage for obtaining the reference ion beam current, obtain a correction value of the condenser voltage by subtracting the calculation value stored for the reference aperture from the experimental value for the reference aperture, obtain the setting values for each of the plurality of types of the apertures by adding the obtained correction value to the calculation values stored for each of the plurality of types of the apertures, and store the obtained setting values in the condenser voltage table.

The deviation of the experimental value from the calculation value of the condenser voltage occurs due to, for example, deviation of the distance between the ion source and the condenser lens from the design value due to the dimension error, or offset of a condenser lens control signal. The dimension error between the ion source and the condenser lens and the offset of the control signal are constant regardless of the type of the aperture, and hence the correction value as the deviation amount of the experimental value from the calculation value of the condenser voltage is also constant regardless of the type of the aperture.

In view of this, the correction value is added to each of the calculation values stored for the plurality of types of apertures, to thereby obtain the setting value of the condenser voltage and store the obtained setting value in the condenser voltage table. With this, merely by obtaining the experimental value of the condenser voltage for obtaining the reference ion beam current for only the reference aperture, the setting values of the condenser voltage for other apertures can be obtained. Therefore, the condenser voltage table can be easily created with high accuracy. Through setting of the condenser voltage based on this condenser voltage table, the condenser voltage can be easily set with high accuracy.

Further, the control portion may be configured to: obtain the setting value by adding the correction value obtained for the reference aperture at a specific extracting voltage to the calculation value stored for the each of the plurality of types of the apertures at an extracting voltage different from the specific extracting voltage, and store the obtained setting value in the condenser voltage table With this, merely by obtaining the experimental value of the condenser voltage for only the reference aperture in the specific extracting voltage, the setting values of the condenser voltages for all of the apertures in all of the extracting voltages can be obtained. Therefore, the condenser voltage table can be created easily.

Further, the control portion may be configured to: obtain the experimental value for each of the extracting voltages, obtain, for each of the extracting voltages, the correction value by subtracting the calculation value stored for the reference aperture from the experimental value, obtain, for each of the extracting voltages, the setting value by adding the correction value to the calculation values stored for each of the plurality of types of the apertures, and store the obtained setting values in the condenser voltage table.

When the needle tip shape of the ion source changes due to the long term use, the generation of the ion beam becomes unstable, and hence it is necessary to change the extracting voltage. Further, when the distance between the ion source and the condenser lens changes due to the change of the needle tip shape of the ion source, the correction value of the condenser voltage also changes.

In view of this, the correction value is obtained for each extracting voltage and then the setting value of the condenser voltage is calculated. With this, the condenser voltage table can be created with high accuracy.

Further, it is preferred that the condenser voltage table is configured to store an arbitrary setting value of the condenser voltage for obtaining an arbitrary ion beam current, and that the control portion is configured to: obtain a first correction value for a first set of the ion source and the condenser lens, obtain a first experimental value of the condenser voltage for obtaining the arbitrary ion beam current, obtain a first calculation value of the condenser voltage for obtaining the arbitrary ion beam current by subtracting the first correction value from the first experimental value, obtain a second correction value for a second set in which at least one of the ion source and the condenser lens is different from the ion source and the condenser lens of the first set, obtain the arbitrary setting value by adding the second correction value to the first calculation value, and store the obtained arbitrary setting value in the condenser voltage table.

Unlike the case of obtaining the calculation value of the condenser voltage for obtaining the reference ion beam current, it is difficult to obtain the calculation value of the condenser voltage for obtaining the arbitrary beam current from a calculation formula. On the other hand, the distance between the ion source and the condenser lens is constant regardless of the ion beam current, and hence the correction value of the condenser voltage is also constant regardless of the ion beam current. That is, the correction value in the case where the arbitrary ion beam current is obtained matches with the correction value in the case where the reference ion beam current is obtained.

In view of this, as for the first set, the first correction value in the case where the reference ion beam current is obtained is subtracted from the first experimental value for obtaining the arbitrary ion beam current, to thereby obtain the first calculation value for obtaining the arbitrary ion beam current. When the first calculation value is known, as for the second set, by merely adding the second correction value in the case where the reference ion beam current is obtained to the first calculation value, the arbitrary setting value of the condenser voltage for obtaining the arbitrary ion beam current can be obtained. Therefore, the condenser voltage table in which the arbitrary setting value of the condenser voltage is stored can be easily created.

According to another aspect of the present invention, there is provided a method of adjusting ion beam optics for a focused ion beam apparatus configured to set a condenser voltage based on a condenser voltage table and including: an ion source configured to supply ions; a condenser lens configured to condense an ion beam extracted from the ion source; the condenser lens including a bipotential lens including: a first electrode configured to extract the ion beam from the ion source in response to application of an extracting voltage between the first electrode and the ion source, and a second electrode configured to condense the ion beam extracted from the ion source in response to application of the condenser voltage between the second electrode and the ion source; a plurality of types of apertures having different aperture diameters and configured to reduce a diameter of the condensed ion beam; and the condenser voltage table configured to store a setting value of the condenser voltage for obtaining a reference ion beam current at which the ion beam diameter is minimized in correspondence with an amount of the extracting voltage and the types of the apertures, the method including: storing in advance, in the condenser voltage table, a calculation value of the condenser voltage for obtaining the reference ion beam current for each of the plurality of types of the apertures; obtaining, for a reference aperture among the plurality of types of the apertures, an experimental value of the condenser voltage for obtaining the reference ion beam current; obtaining a correction value of the condenser voltage by subtracting the calculation value stored for the reference aperture from the experimental value for the reference aperture; obtaining the setting values for each of the plurality of types of the apertures by adding the obtained correction value to the calculation value stored for each of the plurality of types of the apertures; and storing the obtained setting value in the condenser voltage table.

With this, merely by obtaining the experimental value of the condenser voltage for obtaining the reference ion beam current for only the reference aperture, the setting values of the condenser voltage for other apertures can be obtained. Therefore, the condenser voltage table can be easily created with high accuracy.

What is claimed is:

1. A focused ion beam apparatus comprising:
    an ion source configured to supply ions;
    a condenser lens configured to condense an ion beam extracted from the ion source, the condenser lens including a bipotential lens including:
        a first electrode configured to extract the ion beam from the ion source in response to application of an extracting voltage between the first electrode and the ion source, and
        a second electrode configured to condense the ion beam extracted from the ion source in response to application of a condenser voltage between the second electrode and the ion source;
    a plurality of types of apertures having different aperture diameters and configured to reduce a diameter of the condensed ion beam; and
    a control portion including a condenser voltage table configured to store a setting value of the condenser voltage for obtaining a reference ion beam current at which the ion beam diameter is minimized in correspondence with an amount of the extracting voltage and the types of the apertures and being configured to set the condenser voltage based on the condenser voltage table,
    wherein the control portion is configured to:
        store in advance, in the condenser voltage table, a calculation value of the condenser voltage for obtaining the reference ion beam current for each of the plurality of types of the apertures,
        obtain, for a reference aperture among the plurality of types of the apertures, an experimental value of the condenser voltage for obtaining the reference ion beam current,
        obtain a correction value of the condenser voltage by subtracting the calculation value stored for the reference aperture from the experimental value for the reference aperture,
        obtain the setting values for each of the plurality of types of the apertures by adding the obtained correction value to the calculation values stored for each of the plurality of types of the apertures, and
        store the obtained setting values in the condenser voltage table.

2. A focused ion beam apparatus according to claim 1, wherein the control portion is configured to:
    obtain the setting value by adding the correction value obtained for the reference aperture at a specific extracting voltage to the calculation value stored for the each of the plurality of types of the apertures at an extracting voltage different from the specific extracting voltage, and
    store the obtained setting value in the condenser voltage table.

3. A focused ion beam apparatus according to claim 1, wherein the control portion is configured to:
    obtain the experimental value for each of the extracting voltages,
    obtain, for each of the extracting voltages, the correction value by subtracting the calculation value stored for the reference aperture from the experimental value,
    obtain, for each of the extracting voltages, the setting value by adding the correction value to the calculation values stored for each of the plurality of types of the apertures, and
    store the obtained setting values in the condenser voltage table.

4. A focused ion beam apparatus according to claim 1, wherein the condenser voltage table is configured to store an arbitrary setting value of the condenser voltage for obtaining an arbitrary ion beam current, and
    wherein the control portion is configured to:
        obtain a first correction value for a first set of the ion source and the condenser lens,
        obtain a first experimental value of the condenser voltage for obtaining the arbitrary ion beam current,
        obtain a first calculation value of the condenser voltage for obtaining the arbitrary ion beam current by subtracting the first correction value from the first experimental value,
        obtain a second correction value for a second set in which at least one of the ion source and the condenser lens is different from the ion source and the condenser lens of the first set,
        obtain the arbitrary setting value by adding the second correction value to the first calculation value, and
        store the obtained arbitrary setting value in the condenser voltage table.

5. A method of adjusting ion beam optics for a focused ion beam apparatus configured to set a condenser voltage based on a condenser voltage table and including: an ion source configured to supply ions; a condenser lens configured to condense an ion beam extracted from the ion source; the condenser lens including a bipotential lens including: a first electrode configured to extract the ion beam from the ion source in response to application of an extracting voltage between the first electrode and the ion source, and a second electrode configured to condense the ion beam extracted from the ion source in response to application of the condenser voltage between the second electrode and the ion source; a plurality of types of apertures having different aperture diameters and configured to reduce a diameter of the condensed ion beam; and the condenser voltage table configured to store a setting value of the condenser voltage for obtaining a reference ion beam current at which the ion beam diameter is minimized in correspondence with an amount of the extracting voltage and the types of the apertures, the method comprising:

storing in advance, in the condenser voltage table, a calculation value of the condenser voltage for obtaining the reference ion beam current for each of the plurality of types of the apertures;

obtaining, for a reference aperture among the plurality of types of the apertures, an experimental value of the condenser voltage for obtaining the reference ion beam current;

obtaining a correction value of the condenser voltage by subtracting the calculation value stored for the reference aperture from the experimental value for the reference aperture;

obtaining the setting values for each of the plurality of types of the apertures by adding the obtained correction value to the calculation value stored for each of the plurality of types of the apertures; and storing the obtained setting value in the condenser voltage table.

\* \* \* \* \*